(12) United States Patent
Moncrieff

(10) Patent No.: US 8,477,506 B2
(45) Date of Patent: *Jul. 2, 2013

(54) INJECTION MOLDED CONTROL PANEL WITH IN-MOLDED DECORATED PLASTIC FILM THAT INCLUDES AN INTERNAL CONNECTOR

(76) Inventor: Scott Moncrieff, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/464,903

(22) Filed: May 4, 2012

(65) Prior Publication Data

US 2012/0314380 A1    Dec. 13, 2012

Related U.S. Application Data

(63) Continuation of application No. 13/267,801, filed on Oct. 6, 2011.

(60) Provisional application No. 61/495,899, filed on Jun. 10, 2011, provisional application No. 61/495,901, filed on Jun. 10, 2011.

(51) Int. Cl.
    *H05K 1/00*    (2006.01)

(52) U.S. Cl.
    USPC .................. 361/748; 361/679.01; 700/85

(58) Field of Classification Search
    USPC   361/748, 679.01; 700/85; 200/310; 206/443; 324/409; 345/173; 349/122
    See application file for complete search history.

(56) References Cited

U.S. PATENT DOCUMENTS

| | | | |
|---|---|---|---|
| 5,721,666 A | | 2/1998 | Girard |
| 5,995,877 A | * | 11/1999 | Brueggemann et al. ........ 700/85 |
| 6,897,390 B2 | | 5/2005 | Caldwell et al. |
| 7,156,632 B2 | | 1/2007 | Park et al. |
| 7,337,681 B2 | | 3/2008 | Nikaido et al. |
| 7,486,280 B2 | | 2/2009 | Iandoli et al. |
| 2002/0054261 A1 | * | 5/2002 | Sekiguchi ..................... 349/122 |
| 2004/0104727 A1 | * | 6/2004 | Morimoto .................... 324/409 |
| 2004/0156937 A1 | | 8/2004 | Park et al. |
| 2005/0046622 A1 | * | 3/2005 | Nakanishi et al. ........... 345/173 |
| 2005/0205407 A1 | | 9/2005 | Hein et al. |
| 2005/0252758 A1 | * | 11/2005 | Schmidt et al. .............. 200/310 |
| 2007/0181456 A1 | * | 8/2007 | Kusuda et al. ................ 206/443 |
| 2008/0257706 A1 | | 10/2008 | Haag |
| 2010/0013499 A1 | | 1/2010 | Tong et al. |
| 2010/0159183 A1 | | 6/2010 | Nishimura |
| 2011/0018836 A1 | | 1/2011 | Yu |

(Continued)

FOREIGN PATENT DOCUMENTS

KR    100432717 B1    5/2004

OTHER PUBLICATIONS

Min Byung Jo, Authorized Officer, Korean Intellectual Property Office, International Search Report for Application No. PCT/US2012/041396, mailed Jan. 29, 2013, 3 pages.

*Primary Examiner* — Xiaoliang Chen

(74) *Attorney, Agent, or Firm* — Procopio, Cory, Hargreaves & Savitch LLP; Noel C. Gillespie

(57) ABSTRACT

Provided are systems and methods for a control assembly including: a first film that is in-molded that includes decorative graphics, a front surface and a rear surface; and a second film molded to the rear surface of the first film having a printed circuit that includes sensors, control circuits and interconnects and a front and rear surface; and an internal connector.

9 Claims, 4 Drawing Sheets

U.S. PATENT DOCUMENTS

| | | |
|---|---|---|
| 2011/0147051 A1 | 6/2011 | Sims et al. |
| 2011/0186422 A1 | 8/2011 | Lee |
| 2012/0050958 A1* | 3/2012 | Sanford et al. ........... 361/679.01 |
| 2012/0087065 A1* | 4/2012 | Kim et al. ................ 361/679.01 |

* cited by examiner

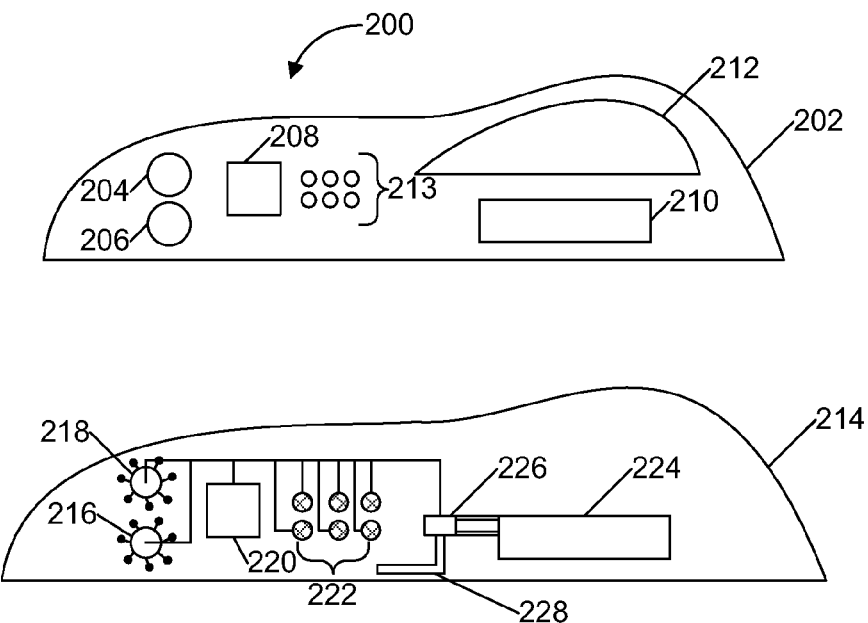
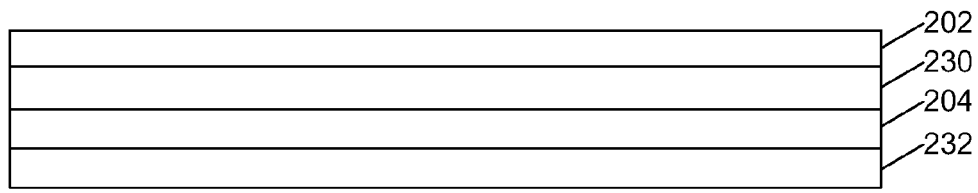
FIG. 2A
FIG. 2B
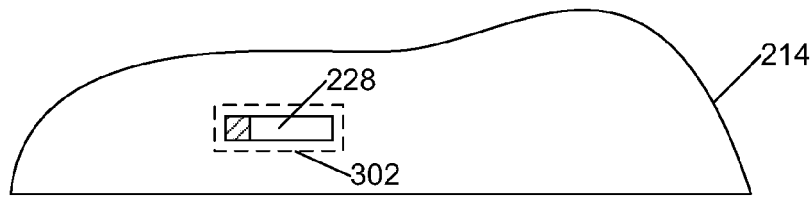
FIG. 3A
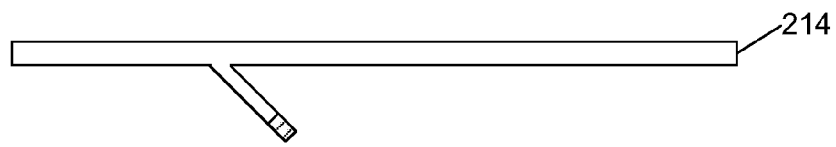
FIG. 3B

INJECTION MOLDED CONTROL PANEL WITH IN-MOLDED DECORATED PLASTIC FILM THAT INCLUDES AN INTERNAL CONNECTOR

RELATED APPLICATIONS INFORMATION

This application claims priority as a continuation in part under 35 U.S.C. 120 to U.S. patent application Ser. No. 13/267,801 entitled "Injection Molded Control Panel With In-Molded Decorated Plastic Film," filed Oct. 6, 2011, which in turn claim priority under 35 U.S.C. 119(e) to U.S. Provisional Patent Application Ser. No. 61/495,899, filed Jun. 10, 2011, and entitled "Injection Molded Control Panel with In-Molded Decorated Plastic Film," and also claims priority under 35 U.S.C. 119(e) to U.S. Provisional Patent Application Ser. No. 61/495,901, filed Jun. 10, 2011, and entitled "Injection Molded Control Panel with In-Molded Decorated Plastic Film that Includes an Internal Connector," all of which are incorporated herein by reference in their entirety as if set forth in full.

BACKGROUND

1. Technical Field

The embodiments described herein are related to injection molding and in particular to methods of reducing the number of separate components and complexity of control panel assemblies.

2. Related Art

When injection molding a control panel, an in-molded decorative plastic film is often included. The molded control panel with the decorative plastic film is then assembled to a separate housing, molded console or "techbox" that includes a PCB with switches, lighting, indicators, knobs, slides, displays etc. The control panel also includes the interconnect wires or circuits, which typically interface with one or more control boards and to other circuits or circuitry. These boards or circuits are often housed within the control panel housing, or in a separate housing.

As a result, there are many potential failure points in a conventional control panel. For example, the switches, indicators, etc., can fail, the interconnects with the circuit boards can fail, the circuit boards themselves can fail, and so on. Such conventional assemblies can also be expensive to manufacture due to all the different components and interconnects and associated assembly, especially if the control panel is part of a small product, uniquely shaped product, a product with complex controls and indicators, or some combination thereof, etc.

SUMMARY

A simplified control panel assembly that comprises two film layers bonded to either side of an injection molded resin and that vastly reduces the complexity and cost of, e.g., control assemblies is disclosed herein.

According to one aspect, an injection molded control panel or component includes a first surface in-mold decorated plastic film and a second film molded to the rear surface having a printed circuit, including at least one of the following, capacitive touch sensors, capacitive touch screen, printed resistors, proximity sensors, water detect sensor, functional antennas, with surface mounted electronic components such as LEDS, resistors, capacitors, transistors, programmable integrated circuits and other electronic sensors.

According to another aspect, molten resin is injected in between the 2 films completely encapsulating both the second surface decoration on the A side film and the conductive circuit with the mounted components on the B side of the molded article.

According to still another aspect, the circuit termination for interconnection remains integral to the circuit yet is made available to directly plug into a separate control board typically found in devices that would use this kind of input device or simply to a power source, should the unit be able to function independently of any other managing device. Total encapsulation of these films and the attached components, insures protection from moisture, water immersion, corrosion, dirt and physical damage, resulting in a significantly more reliable product than available today using prior art.

These and other features, aspects, and embodiments are described below in the section entitled "Detailed Description."

BRIEF DESCRIPTION OF THE DRAWINGS

Features, aspects, and embodiments are described in conjunction with the attached drawings, in which:

FIGS. 2A and 2B are diagrams illustrating an example control panel assembly in accordance with one embodiment.

FIGS. 3A and 3B are diagrams illustrating an example circuit termination or connector in accordance with one embodiment.

DETAILED DESCRIPTION

Figure 1:
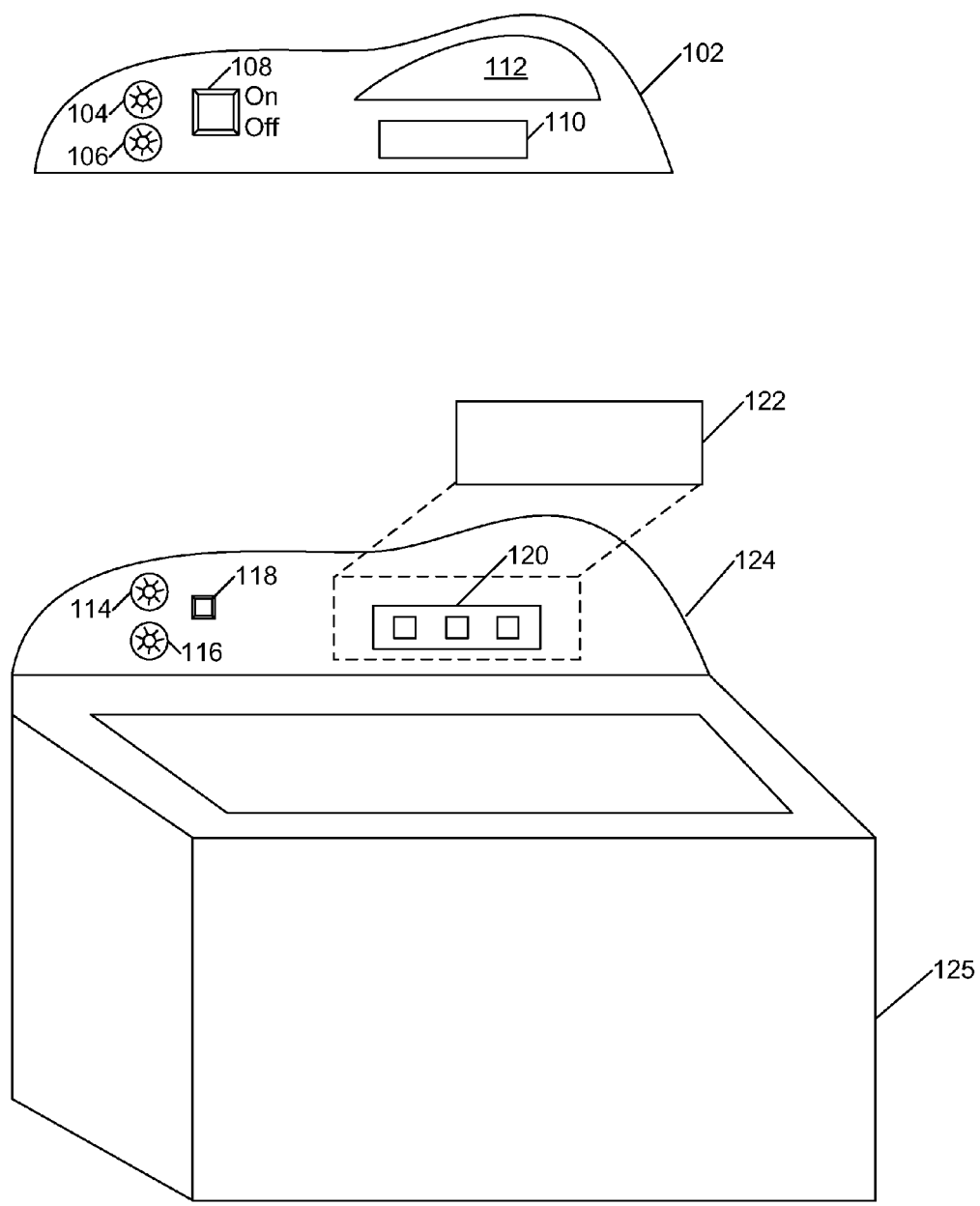
FIG. 1 is a diagram illustrating a conventional control panel assembly in accordance with one embodiment.

FIG. 1 is a diagram illustrating a conventional control panel assembly. For example, this control panel assembly may be the control panel for a washing machine. As such, the assembly can comprise an in-molded decorative plastic panel 102 that includes the graphics one would normally see on a washing machine control panel, such as graphic areas 104 and 106, which can include wash settings and that include holes in the middle where knobs can be inserted; graphic area 108 which can include on off, or start stop indicators and can include a slot or hole for an on off switch or start stop button, etc., and logo area 112 which can include a company logo or brand name. Panel 102 can also include a display window 110 that can fit over, e.g., and LED or LCD display.

Panel 122 can then fit onto control panel 124 of, e.g., a washing machine 125. As can be seen, control panel 124 can include the knobs 114 and 116, switch 118, and display 120 that correspond to graphics 104, 106, and 108 and display window 110. It will be understood that the actual knobs 114 and 116 and switch 118 may be installed after panel 102 is in position over control panel 124. Often, a circuit board 122 will be included within panel 124 along with all of the needed electronics and interconnects needed to control washing machine 125.

But as noted, this type of assembly creates several possible fault areas.

FIGS. 2A and 2B are diagrams illustrating a control panel assembly 200 in accordance with one embodiment. As can be seen in FIG. 2A, the assembly can comprise an in-molded decorative plastic panel 202 that includes graphic areas 204 and 206, which can include wash settings and that include LED windows; graphic area 208 which can include on off, or start stop indicators, other indicator or control input graphics 210, buttons 213 that may not necessarily be limited to just buttons and can be any user interface which responds to user input, and logo area 212 which can include a company logo or brand name. Panel 202 can also include a display window 210 that can fit over, e.g., and LED or LCD display. It should be noted that in some embodiments, decorative film 202 may in fact have no graphics or decoration thereon.

But the assembly can also comprise a second film 214 molded to the rear surface having a printed circuit, including at least one of capacitive touch sensors, proximity sensors, water detect sensor, functional antennas, with surface mounted electronic components such as LEDS, resistors, capacitors, transistors, programmable integrated circuits and other electronic sensors. For example, as illustrated in FIG. 2A, film 214 can include touch sensor assemblies 216 and 218, which can also include LED indicators that light up to indicate a particular setting selection, a touch sensor 220 for making an on off selection, and capacitive touch sensors 222. Film 214 may also include display 224 and single connector 228. In addition, film 214 can include control circuits, such as integrated circuit 226, which can control the operation of sensors, as well as printed interconnects between the various components. Integrated circuit 226 can be one of a number of different products available depending on the application. For example, Cypress makes a control chip that can be used in certain embodiments.

The chip manufacture will often provide design guidelines specifying a maximum length on the sensor trace circuits. Exceeding these recommendations may result in poor or erratic performance. Having the chip 226 on the sensor circuit in close proximity to the sensors themselves will achieve optimal performance vs. locating the chip on a separate PWB (Printed Wiring Board) or FPC (Flexible Printed Circuit).

Capacitive touch sensors can include any of the following: a discrete 1 position sensor that includes at least 1 sensor or there may be many or any combination of the following: (touch, proximity, slider, wheel, temp, presure, etc) or a touch screen or panel that may be either transparent or opaque depending on the application and may be of any size. Capacitive touch sensors 222 may also interface with buttons 213, and buttons 213 may provide any type of user interface, not just buttons, so that user input and actions executed on buttons 213 (e.g., pressing, pushing, sliding) will be registered by the capacitive touch sensors 222. A touch screen may be included with any number of sensors of any type physically able to be mounted and fit in the desired geometry of the finished design.

Film 214 can also include display 224, or in certain embodiments, a window that would go over a display.

As a result, a single connector 228 can be used to interface the assembly 200 with further control circuits or electronics. The single connector 228 is described in more detail below.

The two films 202 and 214 can then be encapsulated with resin between them and then mounted to a plastic housing or console so that the assembly can then be installed, e.g., onto a washing machine. This is illustrated in the side view of FIG. 2B which illustrates that films 202 and 214 can be sandwiched around a resin layer 230 and then be attached to a separate molded console or housing component. This results in a very thin sturdy assembly with fewer potential failure points than a conventional assembly. Such a construction can eliminate the control board 122 included in a conventional assembly, reduce costs, eliminate failures, and allow for easier assembly.

It will be understood that an injection molding tool can be used to inject the resin layer 230 between layers 202 and 214. Conventionally, this would be done at an edge of the assembly; however, this can leave an area at the edge of the part where the resin is injected that needs to be trimmed, which adds costs and time. Moreover, edge injection is not as robust and can actually create problems because it tends to stretch, distort and in some cases destroy the films, due in part to the fact that the resin is being injected at a single point along the edge.

Thus, in certain embodiments, an injection molded tool can be configured to inject the resin at points internal to the assembly. Thus, holes can be precut in, e.g. film 214. Injection gates can then be configured in the tool that line up with the precut holes and that allow the resin to not only be injected through the holes, but also allow injection through each hole/pin to be individually controlled. This eliminates edge cutting, is more robust, allows more control and uniform injection that avoids the problems of edge injection, etc.

FIGS. 3A and 3B illustrate an internal connector that can be included in assembly 200. In a conventional process, the connector is often brought out from the edge of the assembly. This is because in the case of an over molded decorated film the connector is typically printed on the rear surface of the decorated first film and cannot be cut out for release after molding as it would result in damage to the finished decorated surface resulting in an unacceptable finished component. In the case of a back-molded decorated film the connection tail is completely encased in resin, and cannot be accessed for any purpose as it has to protrude from the finished molded part so that it is not encapsulated by the resin. As a result, in a conventional assembly the connector must extend from the edge of the film.

But as illustrated in FIGS. 3A and 3B, in the embodiments described herein, the connector 228 can be internal to film 214. This is accomplished by selectively printing the thermal binder everywhere on the rear surface of the circuit film except the face of the connector tail desired to protrude from the finished part after molding. Connector 228 can then be precut in film 214 and remain connected via a perforated connection 302 around the perimeter of connector 228. In this manner connector 228 will not be affected, deformed or damaged by the molding process, i.e., high heat, pressure, etc.

After the assembly is molded, the perforated connection points from the perforate connection 302 can be cut, allowing the tail of the connector 228 to be separated from the molded resin such that it can be assembled, e.g., connected to the control board of a washing machine.

Figure 4:
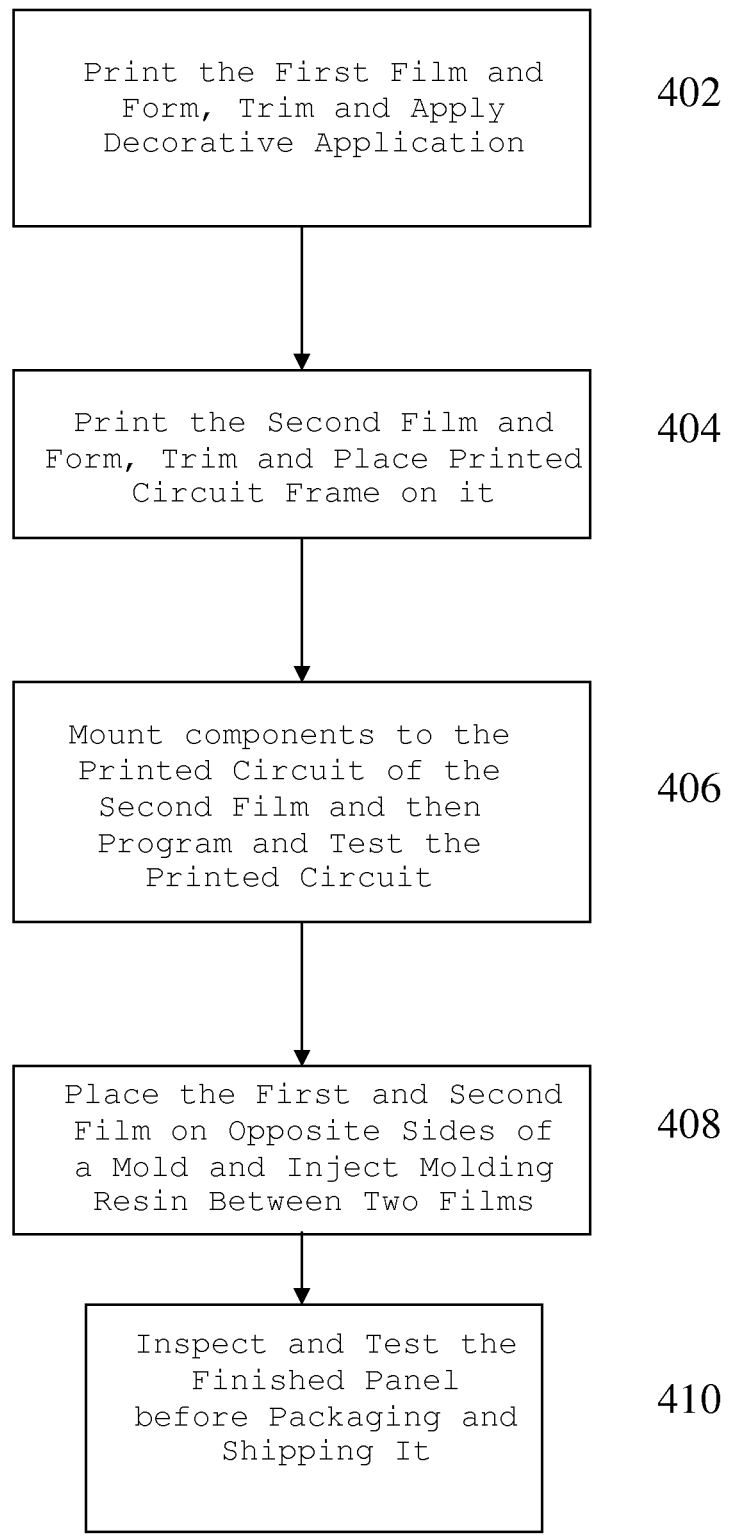
FIG. 4 is a flowchart illustrating an example method for fabricating an injection molded control panel in accordance with one embodiment.

FIG. 4 illustrates a method for fabricating an injection molded control panel in accordance with an embodiment. In step 402, the first film is printed, formed (forming optional), trimmed and a decorative application is applied thereto. The first film can be placed on the top or bottom of the second film in the finished panel. The second film is printed in step 404, as well as formed (forming optional), trimmed and a printed circuit frame is placed on it in order to make the printed circuit functional eventually. The second film can be placed on the top or bottom of the first film in the finished panel. In step 406, the components can be mounted to the printed circuit (the second film) in the printed circuit frame, and the printed circuit is programmed and then tested. In step 408, the first and second films are placed on opposite sides of the mold using robotics and then the molding resin is injected in between the 2 films. In one embodiment, the first and second films are placed on opposite sides of the injection mold, one film in the cavity and one film in the core so that the resin can be injected between the two films. In step 410, the completed finished panel is inspected, masked, tested and packaged for shipment.

Figure 5:
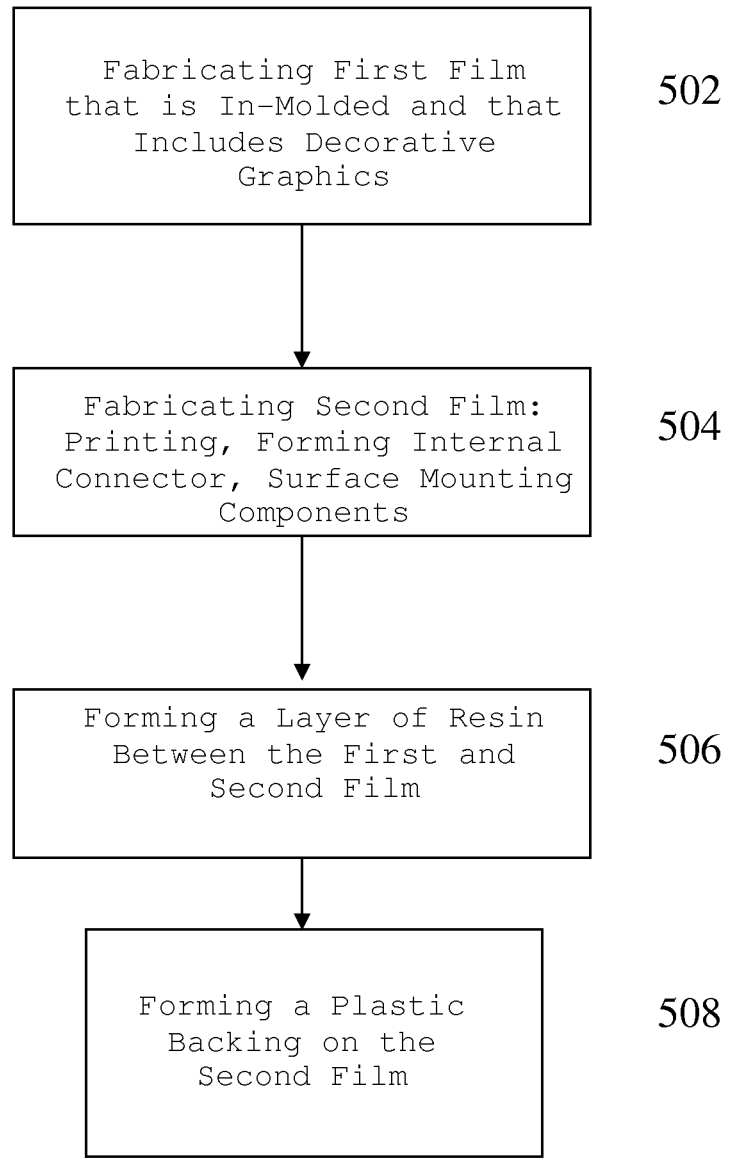
FIG. 5 is a flowchart illustrating an example method for fabricating an injection molded control panel in accordance with one embodiment.

FIG. 5 illustrates another example method for fabricating an injection molded control panel in accordance with an embodiment. In step 502, fabricating a first film that is in-molded and that includes decorative graphics is performed. In step 504, fabricating a second film is performed, wherein fabricating the second film includes: printing a circuit on the second film, forming an internal connector on the second film that is connected to the second film via a perforated or discontinuous connection such that a portion of it can be separated from the second film after molding. In step 506, a layer of resin is formed between the first and second film. This can be performed by injection molding or other related methods. In one embodiment, the first and second films are placed on opposite sides of the injection mold, one film in the cavity and one film in the core so that the resin can be injected between the two films. In step 508, the molded part can be attached to a plastic housing or molded console. The first or second films comprise one or more of a flat film, a preformed film, or a film formed in the mold tool Relevant graphic film print methods include silkscreen, offset, flexo, gravure or digital using any combination thereof (either sheet or roll to roll), circuit film print methods include silkscreen, flexo, gravure using any combination thereof (either sheet or roll to roll), forming methods include hydroform, high pressure forming, thermoforming, trimming methods include using either 2D or 3D trim tools, laser cutting, or digital knife methods; component mounting methods include conventional mounting for PCB or FPC, molding details include cutting holes in circuit layer and shooting resin through holes directly into decorative layer pinning both films to the core of the tool.

Circuit print details of the circuit may include: C1 (Circuit Layer 1): conductive silver ink is deposited onto a 7 mil (could be other gauges) stabilized or unstabilized PET substrate or other suitable substrate for the application. In one embodiment, the decoration film 1st surface may include anti-microbial properties or other special features such as anti-scratch hard-coat or mar resistant coating, as well as commonly know texture treatments of finishes. In addition to known plastic films, other common materials may be in-molded as well such as wood veneer, flocked products, leather, and fabrics such as denim and pseudo suede synthetic imitations. C2: applying (steady state) dielectric bridges if a crossover circuit is required; C3: applying conductive silver bridges; C4: applying carbon resistor pads and conductor tips; C5: printing entire circuit area (except for circuit interconnect tips) with a di-electric coating; C6: printing entire circuit area (except for circuit interconnect tips and the tail area adjacent to the tips making up the free connector tail) with a molding binder resin; TouchScreen print details (1 of the typical methods); C1: applying PDOT conductive polymer onto a 7 mil stabilized PET substrate; C2: Print Silver circuit pattern 1 (which instead of or in addition to may be a Flexible Printed Circuit or FPC); C3 applying dielectric bridges if a crossover circuit is required; C4 applying Silver circuit pattern 2 (or FPC); C5: applying carbon resistor pads and conductor tips; C6: Print entire circuit area (except for circuit tips) with a dielectric coating; C7: Print entire circuit area (except for circuit tips and the area adjacent to the tips making up the free connector tail) with a molding binder resin.

In one embodiment, the present disclosure provides the creation of in-molded elements without elements sticking out, abutting or otherwise disturbing the compact packaging of the finished panel. In one embodiment, the present disclosure provides the seamless molding of compact packages of components that conserve resources and manufacturing materials.

In one embodiment, the component mounting Process includes the steps of (and the order is not limited to the steps disclosed): S1: applying conductive silver epoxy aligned to component mounting pads; S2: dispensing a glue at every component location to insure a solid bond with the film; S3: placing components either manually or using conventional pick and place equipment (automated robotic placement); S4: cure conductive epoxy and glue at manufacturer's recommended time and temperature if required.

In one embodiment, provided is an injection molded control panel or component with a first surface in-molded decorated plastic film and a second film molded to the rear surface having a printed circuit, including capacitive touch sensors, capacitive touch screen, camera lens's or miniature cameras, proximty sensors, water detect sensors, functional antennas, with surface mounted electronic components such as LEDS, resistors, capacitors, transistors, seven segment or similar type displays, programmable integrated circuits and other electronic sensors.

In one embodiment, molten resin is injected in between two films completely encapsulating both the second surface decoration on the A side film and the conductive circuit with the mounted components on the B side of the molded article. A unique feature of this article is the novel way the circuit termination for interconnection remains integral to the circuit yet is made available to directly plug into a separate control board that is typically found in devices that would use this kind of input device or simply to a power source, should the unit be able to function independently of any other managing device. Total encapsulation of these films and the attached components insures protection from moisture, water immersion, corrosion, dirt and physical damage—thereby resulting in a significantly more reliable and structurally stronger product than is available today under the prior art.

Specific features include a unique method to connect the in-molded circuit directly to an external interface or connection point that is also designed to encapsulate all the electronics protecting them from any and all environmental impacts. This method cannot be achieved using a single film construction. This is the most advantageous and robust type of connection that could be made having a high degree of reliability and a very low probability of errors due to the simple single level direct connection with no intermediary connections that could double or triple the chance of a failure. Having the chip integral to the circuit means that regardless of the number of circuits needing to be controlled there will in most applications only ever be 5 traces to connect and transmit the already converted digital signal.

The present disclosure provides protection from contamination or moisture that may degrade and corrode the circuitry and electronic components over time that would normally result from exposure to the environment. A desirable characteristic for any device, but essential for many products and applications including appliances, automotive components, commercial and residential lighting and control, medical equipment and devices (long life and easily disinfected and sterilize without risk to electronics or the graphic interface), office equipment (copiers, fax machines, telephones), products designed for outdoor environments (gas station pumps, kiosks/teller machines, parking lot ticket machines, vending machines), exercise equipment (that are easily disinfected), manufacturing (controls operating in harsh environments), military applications and aerospace to name a few.

The present disclosure also provides a significant cost saving over conventional and alternative methods typically used in today's products. Embodiments consist mostly of a face panel (with or without IMD—or In-moulded Decoration) with the electronic components including mechanical switches, LED's, 7 segment displays, light guides, resistors, capacitors, and so on—all mounted to a PWB which in turn is mounted inside an injection molded housing (box) with molded features designed to activate the mechanical switches and direct light from the LED's.

The present disclosure also provides for a much thinner form factor than is available today using conventional technology (typically 2-5 mm total thickness with 3-4 mm being a preferred dimension versus conventional dimensions, which can be up to 1" thick or more). Embodiments can include a face panel but requires an additional Box (tech box) that can typically be an additional 0.500" to 1.00" thick.

Current processes of the present disclosure also may result in a thin profile flat panel that is difficult to achieve with a single sided film construction. This process combines numerous electronic components into a single decorated, now electrically functional molded panel. The fully integrated panel provides the functionality of what now requires multiple components (populated PWB, molded plastic components and wiring harness with multiple connectors, LED lighting, light guides/diffusers/reflectors).

Integrated ICs may also be a component of the circuit and may also be molded in the panel. There are numerous benefits to having this programmable IC molded into the part and be as close as possible to the sensors.

First, in capacitive touch switch applications where the chip is being used to sense and communicate a switching event, it is imperative that the chip be as physically close to the sensors as possible and cannot exceed specified trace lengths. The reason for this is that excessive run lengths are susceptible to electronic noise, interference, and false touches, or unrecognized touches which results in an unreliable switching/control device. Should the IC need to be mounted on a remote PWB or FPC the signal (analog prior reaching the IC) is needlessly exposed to outside influences which can confuse or destroy the original signal before it has a chance to be converted into a much more reliable signal.

Second, another benefit is that once the chip has sensed "a touch", the signal is converted from analog to digital and then transmitted on to the device or master controller as a digital signal. It is beneficial to convert the signal at the earliest opportunity in the process so as to eliminate the possibility that electrical noise or other interference may have a detrimental effect on the communication or trigger a false switch signal or no signal at all.

Third, embedding the IC into the molded resin at 450° F. insures the component will never be affected by harsh or detrimental environment damage such as moisture or corrosive vapors typically found in operating environments of appliances, automobiles, military equipment or anything that is subjected to weather or harsh manufacturing environments. The circuit and components being encapsulated are protected from physical damage as well.

Fourth, having the chip molded in the circuit eliminates the need to run a trace out for every circuit built into the panel (which is what you have to do if the IC is mounted on another FPC or PWB)—thereby keeping the number of traces on the connection tail to a total of 5 regardless of the number of switches or LEDs in the circuit. This is a standard feature of the PSOC chip made by Cypress technologies. A circuit without this chip in-molded that was controlling 10 sensors and 10 LEDs would require at least 25 leads (versus the 5 required in the design of the present disclosure). More leads require larger and more expensive connectors and have a much higher probability for failure than a 5 lead interconnect.

Fifth, fewer components means fewer potential possibilities for failure.

Sixth, molding the film circuit containing the various components eliminates the need for the end user to manage, procure, and assemble the many components that are now all rolled into one functional device that literally occupies no more space than was previously dedicated to the In-Molded decorated control panel itself. This will open up opportunities for designs, geometries and form factors previously difficult to conceive.

Seventh, and finally, the embedding of the integrated circuit allows the HMI (Human Machine Interface) to be remote from the CPU or master control allowing it to be potentially a much smaller package than it would otherwise have to be depending on what the device or unit is.

There are also a number of benefits that accompany the two film construction. First, panels stay flat. In this relatively thin geometry which is typical for control panel applications and mandatory for applications using capacitive touch sensors, having a film layer on both the front and a rear surface of the finished molded panel results in an extremely flat part where as in a typical single film construction panel, flatness is difficult to achieve due to the uneven shrink rates of the molding resins and the film. Flat panels are preferred by the end user as warped panels are extremely difficult to assemble and hold in place—often requiring special adhesives which add cost in materials and labor. Flat panels offer significant benefits in the way of long term performance, ease of assembly and cost savings.

Second, the construction of having a film layer on both sides of the finished molded resin makes for a much stronger finished component that will have a much higher impact resistance and be less prone to physical damage or failure, in the event it is dropped or stressed in some extreme condition.

Third, with a film layer on both sides of the panel, the panel will be less prone to expansion and contraction issues that are commonly experienced with temperature extremes. Having a more stable plastic component is a desirable feature and less prone to failures that can be caused by the expansion and contraction of a plastic component with temperature change.

Fourth, part size remains more consistent in the molding process with the two-film construction and as a result, a slight variation in the molding process does not result in any significant dimensional change in the part that may be experienced in a single or no film type construction.

A number of weight and space savings also occur with the design of the present disclosure. For instance, having all the components that the present disclosure either replaces eliminates or integrates into the molded part results in a significant weight and space reduction as compared to what is typically required. A membrane circuit printed on a PET (Polyethylene Terephthalate) film weighs significantly less than a PCB with mechanical switches, wire harnesses, connectors and the molded plastic components required to house the PCB and actuate the mechanical switches. With transportation costs skyrocketing this is more important than ever.

A number of tooling cost and engineering expense savings, durability features, and environmental benefits also accompany the design of the present disclosure. The present disclosure has environmental advantages as compared to the use of conventional printed circuit boards that typically contain copper traces and lead (e.g., solder for mounting the components). The manufacturing method of making PCBs and FPCs is a subtractive process that uses corrosive acid etchants and other environmentally unfriendly chemicals which must be disposed of in the process. The printing of silver traces is also an additive process and does not generate hazardous waste.

Furthermore, the present disclosure enjoys the use of proven and reliable technology in the way of a printed silver circuit that has been used in the manufacture of membrane switches for many years, following the technology to surface mount electronic components using a conductive silver epoxy.

The present disclosure method of combining the decoration layer, sensors and electronic components into a single molded component now makes it possible to provide a thin-profile, fully-functional panel that until now has required, in addition to the non functional decorated panel, a circuit board and/or a FPC, associated electronic SM components, LEDs, light guides, light pipes, molded switch housings, molded switch actuators, light blocking baffles and the handling and assembly of all these individual components into a single unit. Now all of these components are contained in and occupy the space of what was just the decorated component itself.

The present disclosure provides a reliable and durable long life control panel for appliance, automotive, aerospace, electronic, industrial, medical and consumer products. The present disclosure also integrates and combines numerous features into a single, highly-decorated functional panel, containing graphics and molded-in circuitry including capacitive switch technology (printed sensors), associated circuits, electronic components, LEDS, and light guide features. The present disclosure also resolves and remedies existing problems such as electronic circuits being susceptible to corrosion and damage when exposed to highly corrosive and hostile environments. Furthermore, the existing art has not provided a means for a clean/uninterrupted cost effective connection/interface from the molded/encapsulated circuitry to associated external control boards. Nor has the existing art provided a means for making a thin wall 3-4 mm perfectly flat. The existing art must actually mount a PSOC chip, for example, after a connection to the sensor circuit which is not recommended or desirable from a performance and reliability perspective.

Furthermore, silver printed membrane circuits are subject to failure (silver migration that causes shorting between circuits) when used in high humidity environments and exposed to moisture. This method of fully encapsulating the silver traces in plastic protects the circuitry from moisture and this commonly known failure mode. Therefore, FPCs may be used instead of printed silver circuits. Also, conventional applications using capacitive touch membranes that don't employ in-molding rely on an adhesive system (PSA, epoxy, urethane, or radiation curable) to adhere the sensor circuit (typically a FPC) to the rear surface of a pre-molded or otherwise prefabricated control panel. This extra step of adhering the membrane to the panel is not only time consuming and costly, but involves the use of expensive adhesives as well as time to apply these adhesives to the FPCs prior to application. Other applications involve the use of PWB that typically must be assembled in plastic housings and then attached as a complete assembly to the decorated panel, usually by snaps, screws, or other securing hardware, all labor intensive and costly in comparison to the present disclosure.

The conventional assemblies or known prior art also experiences the problems of having a circuit interface that is problematic, clumsy, and requiring complicated secondary and additional operations to install, implement, or manufacture. Existing circuit interfaces involve an additional connection point which is eliminated in this new art, which provides for a continuous uninterrupted circuit that connects directly to the interface point.

In the prior art, circuitry and mounted components are also exposed to environment and potentially damaging moisture and corrosive elements in some applications. Unless these circuits have been conformably coated (at additional cost) they are subject to deterioration and failure. Furthermore, circuits mounted as a secondary operation incur additional cost in adhesive and labor expenses to apply. Alignment can be difficult and tedious.

The current art generally is designed around a single film substrate that contains both the decoration layer and the capacitive sensing circuitry. In other constructions, the decoration film is laminated to the circuit sensing layer prior to molding. This construction is subject to delamination and failure. This construction is also not suitable for surface mounting of electrical components since after molding it would show a witness on the first surface user interface. Apparently the conventional thinking was that a single layer construction provided a cost benefit vs. a two layer In-Moulded process, or it was not know that it was possible to mold a thin wall panel and contain the plastic resin between a front and rear film layer essentially encapsulating both the decorated surface and the circuit surface with molten plastic which provide permanent protection for essentially a lifetime.

In summary, the benefits of the present disclosure include: a thin profile, durable, light-weight, a long-life due to encapsulation of all critical components, a unique interface/connection as a strong design/method, simplicity, cost benefits and significant cost savings, design benefits such as a much smaller or thinner package than existing technologies which integrates numerous components of prior art into a single functional panel, integrated enhanced lighting, touch switching (capacitive touch sensing), proximity sensing, switch tuning with respect to a 1-5 mm panel thickness, lighting control including On/Off, Dimming, scene programming, timing, light sequencing, integration of other various kinds of sensors such as temperature and pressure, molding a sensor so that a PSOC can process and transmit the digital data, touch screen control, slider control, wheel control, water detection, knob simulation (similar to wheel function to simulate the function of a real knob), and more.

Applications of the present disclosure also include: all human-machine interface applications, being beneficial for applications in any environment that is detrimental to electronic controls such as spa controls, washing machines, dish washers, fish finders, automotive test equipment, etc., appliance Control panels such as washers, dryers, dishwashers, blenders, toasters; automotive or "center stack consoles" that house switching and lighting functions, medical equipment which has a clean smooth surface that is easily cleaned and disinfected, marine electronic controls and devices including waterproof light fixtures, underwater lighting and lighting control impervious to salt atmosphere, handheld devices subject to daily exposure to harsh environments, commercial appliances such as coffee makers, soda dispensers, and other commercial equipment found in restaurants or cafeterias, consumer electronic devices subject to heavy use and potentially harsh environments: TV's, Stereos, consumer toys where durability and sealed electronics are important for safety reasons with small children, commercial and consumer lighting controls, commercial and consumer HVAC controls, manufacturing controls used in harsh environments and/or requiring a thin profile or geometry, remote controls, Automotive "badging" molded in the shape of the cars logo or name with colored transparent areas that light up including special effects scenes programmed in the chip molded in the badge (e.g., runs on standard 12 Volt systems in a car), automotive badging as described above that is also a functional switch, such as the badge on the rear of a vehicle that is also a functional touch switch that in addition to being illuminated, could for instance open the trunk when the logo is touched (activating an electric latch release)—the intelligence in the chip makes it possible to ignore false activation or have the ability to require a certain type of touch or multi touch in order to activate, or the badge could simply be an "illuminate only" molded part, that simply lights up with the supply of voltage as any standard automotive marker light. Further applications include: signage, with animation and built in lighting control, and switching (On/Off and different operational modes or Stand-Alone with power only once programmed and which can be re-programmed at will), Point of sale terminals, ATM's, parking lot terminals, parking meters, entry keypads used in security systems, and intercom terminals.

Versions of the technology and methods/processes to make the technology include: in-molded decorated film (could be film only not decorated), in-molded circuit (any method used today to make a flexible film circuit, printed silver circuit on film, FPCs, copper circuit on film, and produced via any known method), ITO (Indium Tin Oxide) on film, PDOT (Polydioctyl-bithiophene) or any other conductive polymer typically used or suitable for this application, film gauge range typically 3-30 mil, in-molded capacitive switches (printed sensors or touch screen), in-molded LED lighting, in-molded light guide features to control and direct molded in LEDs, which can be printed or molded features within panel designed to direct and/or block light, in-molded electronic components, including any printable component such as resistors, OLEDs, capacitors, transistors, in-molded touch screen sensors (transparent or opaque), in-molded antennas integrated with the circuit (Wi-Fi, Bluetooth, RF, RFID, etc), in-molded component sensors (e.g., Cypress), in-molded camera lenses. So in summary what we really have is a molded plastic panel with the first surface being a decorated film (although it could be clear without graphics) with the second surface being a film circuit typically with surface mounted electronic components. After that it could be all of the above in its most complex version or any combination of the described options or any single one of the described items.

A brief description of the Process Outline includes the steps of (not limited to any order): Printing the second surface, Form, Trim, Decorative application (1st surface of finished panel); Printing the 1st surface, Form, Trim, Functional Circuit (2nd surface of finished panel); Mount components to printed circuit, program and test; Place films in mold using robotics and in inject molding resin; Inspect, Mask, Test and package for shipment.

Relevant Graphic Film Print methods include Silkscreen, Offset, Flexo, Gravure or Digital using any combination thereof (either sheet or roll to roll), Circuit Film Print methods include Silkscreen, Flexo, Gravure using any combination thereof (either sheet or roll to roll), Forming methods include Hydroform, High pressure forming, Thermoforming, Trimming methods include Use either 2D or 3D trim tools, laser cutting, or digital knife methods, component mounting methods include Conventional methods for PCB or FPC, Molding details include cutting holes in the circuit layer and shooting resin through holes directly into the decorative layer pinning both films to the core of the tool. It seems as though two layer In-Molded Layers (no circuitry) has been attempted via edge gating.

Circuit print details of the circuit may also include: C1 (Circuit Layer 1): conductive silver ink is deposited onto a 7 mil stabilized PET substrate or other suitable substrate for the application. In one embodiment, the decoration film on the 1st surface may include anti-microbial properties or other special features such as anti-scratch hard-coat or mar-resistant coating, as well as commonly know texture treatments of finishes. In addition to known plastic films, other common materials may be in-molded as well, such as wood veneer, flocked products, leather, and fabrics such as denim and seudo suede synthetic imitations. C2: applying (steady state) dielectric bridges if a crossover circuit is required; C3: applying conductive silver bridges; C4: applying carbon resistor pads and conductor tips; C5: printing entire circuit area (except for circuit tips) with a di-electric coating; C6: printing entire circuit area (except for circuit tips and the area adjacent to the tips making up the free connector tail) with a molding binder resin; TouchScreen print details (1 of the typical methods); C1: Revise print layers per previous edit applying PDOT conductive polymer onto a 7 mil stabilized PET substrate; C2: applying dielectric bridges if a crossover circuit is required; C3: applying PDOT conductive polymer bridges; C4: applying carbon resistor pads and conductor tips; C5: Print entire circuit area (except for circuit tips) with a dielectric coating; C6: Print entire circuit area (except for circuit tips and the area adjacent to the tips making up the free connector tail) with a molding binder resin.

In one embodiment, the component mounting Process includes the steps of (and the order is not limited to the steps disclosed): S1: applying conductive silver epoxy aligned to component mounting pads; S2: dispensing a glue at every component location to insure a solid bond with the film; S3: placing components either manually or using conventional pick and place equipment (automated robotic placement); S4: cure conductive epoxy and glue at manufacturer's recommended time and temperature if required.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed:

1. A method for constructing a two layer control assembly comprising,
    fabricating first film that is in-molded and that includes decorative graphics;
    fabricating a second film, wherein fabricating the second film comprises:
        printing a circuit on the second film,
        forming an internal connector on the second film that is connected physically and electrically to the second film via a perforated or discontinuous connection such that it can be disconnected from the second film after assembly, and
        surface mounting components on the second film;
    forming a layer of resin between the first and second film; and
    forming a plastic backing to be mounted on the second film.

2. The method of claim 1, wherein fabricating the second film further comprises forming a capacitive touch sensors on the second film.

3. The method of claim 1, wherein fabricating the second film further comprises forming a proximity sensors on the second film.

4. The method of claim 1, wherein fabricating the second film further comprises forming a water detect sensor on the second film.

5. The method of claim 1, wherein fabricating the second film further comprises forming printing a functional antenna on the second film.

6. The method of claim 1, wherein fabricating the second film further comprises mounting a display on the second film.

7. The method of claim 1, wherein fabricating the second film further comprises surface mounting at least one of LEDS, resistors, capacitors, transistors, programmable integrated circuits and other electronic sensors on the second film.

8. The method of claim 1, wherein the first or second films comprise one or more of a flat film, a preformed film, or a film formed in the mold tool.

9. The method of claim 1, wherein the plastic is between the first and second films and encapsulates the circuit and various printed features and mounted components.

* * * * *